(12) United States Patent
Suzuki (10) Patent No.: US 10,728,480 B2
(45) Date of Patent: Jul. 28, 2020

(54) SOLID-STATE IMAGE SENSOR AND IMAGE CAPTURING DEVICE WITH SETTING OF GATE VOLTAGES OF TRANSFER AND RESET TRANSISTORS

(71) Applicant: Ricoh Company, Ltd., Tokyo (JP)

(72) Inventor: Atsushi Suzuki, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 42 days.

(21) Appl. No.: 16/103,300

(22) Filed: Aug. 14, 2018

(65) Prior Publication Data

US 2019/0068905 A1  Feb. 28, 2019

(30) Foreign Application Priority Data

Aug. 24, 2017 (JP) ................. 2017-161472

(51) Int. Cl.
| | |
|---|---|
| H04N 5/335 | (2011.01) |
| H04N 5/374 | (2011.01) |
| H04N 5/376 | (2011.01) |
| H01L 25/16 | (2006.01) |
| H01L 27/146 | (2006.01) |
| H04N 5/369 | (2011.01) |
| H04N 5/3745 | (2011.01) |
| H04N 5/363 | (2011.01) |

(52) U.S. Cl.
CPC .......... H04N 5/374 (2013.01); H01L 25/167 (2013.01); H01L 27/14643 (2013.01); H04N 5/363 (2013.01); H04N 5/3698 (2013.01); H04N 5/3745 (2013.01); H04N 5/3765 (2013.01)

(58) Field of Classification Search
CPC ...................................... H04N 5/363
See application file for complete search history.

(56) References Cited

U.S. PATENT DOCUMENTS 8,023,021 B2 * 9/2011 Adkisson ............ G06F 17/5063
348/296
2005/0046717 A1 * 3/2005 Lapstun ............... H04N 5/3559
348/308

(Continued)

FOREIGN PATENT DOCUMENTS

| JP | 2007-110630 | 4/2007 |
|---|---|---|
| JP | 2010-109902 | 5/2010 |

(Continued)

*Primary Examiner* — Gary C Vieaux
(74) *Attorney, Agent, or Firm* — Xsensus LLP (57) ABSTRACT

An improved solid-state image sensor including a plurality of pixels. Each of the pixels includes a photoelectric convertor to convert a light signal into an electrical charge; a transfer transistor to transfer the electrical charge to a floating diffusion; a reset transistor to reset the floating diffusion; and an amplifier transistor to amplify a signal when the floating diffusion is connected to a gate of the amplifier transistor. A first voltage is set less than or equal to a second voltage. Each of a third voltage and a fourth voltage is set higher than a voltage of a ground. The third voltage is a gate voltage of the transistor resistor at times other than the time of reading a signal of the pixel and the fourth voltage is a gate voltage of the reset transistor at times other than a reset time of the reset transistor.

5 Claims, 8 Drawing Sheets

(56) References Cited

U.S. PATENT DOCUMENTS

| | | | |
|---|---|---|---|
| 2006/0001061 A1* | 1/2006 | Miyatake | H04N 3/155 257/292 |
| 2010/0259662 A1* | 10/2010 | Oike | H04N 5/335 348/308 |
| 2016/0309101 A1* | 10/2016 | Itano | H01L 27/14609 |
| 2017/0244919 A1 | 8/2017 | Suzuki | |
| 2017/0251158 A1* | 8/2017 | Aibara | H04N 5/37455 |
| 2017/0256575 A1 | 9/2017 | Suzuki | |
| 2017/0272742 A1 | 9/2017 | Suzuki et al. | |
| 2018/0190208 A1* | 7/2018 | Kimura | G09G 3/3291 |

FOREIGN PATENT DOCUMENTS

| | | |
|---|---|---|
| JP | 2015-106908 | 6/2015 |
| JP | 2017-055370 | 3/2017 |
| JP | 2017-152481 | 8/2017 |
| JP | 2017-162886 | 9/2017 |
| JP | 2017-175239 | 9/2017 |

* cited by examiner

SOLID-STATE IMAGE SENSOR AND IMAGE CAPTURING DEVICE WITH SETTING OF GATE VOLTAGES OF TRANSFER AND RESET TRANSISTORS

CROSS-REFERENCE TO RELATED APPLICATION

This patent application is based on and claims priority pursuant to 35 U.S.C. § 119(a) to Japanese Patent Application No. 2017-161472, filed on Aug. 24, 2017 in the Japan Patent Office, the entire disclosure of which is hereby incorporated by reference herein.

BACKGROUND

Technical Field

Embodiments of the present disclosure relate to a solid-state image sensor and an image capturing device including the solid-state image sensor.

Background Art

Complementary metal oxide semiconductor (CMOS) image sensors are one example of solid-state image sensors for use in, for example, facsimile machines, copiers, scanners, video cameras, and digital cameras.

Such CMOS image sensors include pixels each including a photoelectric convertor such as a photodiode (PD), a floating diffusion (FD) node, a transfer transistor, a reset transistor, and an amplifier transistor.

The photoelectric convertor receives light and converts the light into signal charge. The signal charge is transferred to the FD.

The transferred signal charge is read out as the potential of the FD.

The potential of the FD is obtained by correlated double sampling (CDS) as the potential difference between the floating diffusion to which the signal charge has been transferred from the photoelectric convertor and the floating diffusion FD that is reset.

SUMMARY

In one aspect of this disclosure, there is provided an improved solid-state image sensor including a plurality of pixels. Each of the pixels includes a photoelectric convertor to convert a light signal of light striking the photoelectric convertor into an electrical charge; a transfer transistor to transfer the electrical charge from the photoelectric convertor to a floating diffusion; a reset transistor to reset the floating diffusion; and an amplifier transistor to amplify a signal when the floating diffusion is connected to a gate of the amplifier transistor. A first voltage is set less than or equal to a second voltage. The first voltage is a gate voltage of the transfer transistor at a time of reading a signal of the pixel and the second voltage is a drain source voltage of the reset transistor. Each of a third voltage and a fourth voltage is set higher than a voltage of a ground. The third voltage is a gate voltage of the transistor resistor at times other than the time of reading a signal of the pixel and the fourth voltage is a gate voltage of the reset transistor at times other than a reset time of the reset transistor.

In another aspect of this disclosure, there is provided an improved image capturing device including the above-described solid-state image sensor; an optical system to guide light input to the optical system to the photoelectric convertor of the solid-state image sensor; and control circuitry. The control circuitry processes a signal output from the solid-state image sensor; and drives an operation of the solid-state image sensor.

BRIEF DESCRIPTION OF THE DRAWINGS

The aforementioned and other aspects, features, and advantages of the present disclosure will be better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

A description is given below of an image capturing device 1000 and an image capturing method according to at least one embodiment of the present disclosure, referring to the drawings.

In the following, embodiments of the present invention are described with reference to the accompanying drawings.

Note that identical components are provided with the same reference numerals and repeated descriptions of the same components are omitted.

A complementary metal oxide semiconductor (CMOS) image sensor is produced using a typical CMOS producing method. In the CMOS image sensor, both an analog circuit and a digital circuit are mounted on the identical chip, which advantageously reduces the number of peripheral integrated circuits.

The CMOS image sensor includes a pixel unit 10 that includes a plurality of pixels 11, and peripheral circuits provided around the pixel unit 10.

Each pixel 11 includes, for example, a photoelectric convertor, such as a photodiode, a floating diffusion FD node (hereinafter "floating diffusion" or simply "FD"), a transfer transistor TX, a reset transistor RT, and an amplifier transistor SF.

Upon light striking the exposed photoelectric convertor, the photoelectric convertor converts the light into an electrical signal, and generates and accumulates signal charge therein.

The accumulated signal charges are transferred to the floating diffusion FD by turning on the transfer transistor. Subsequently, the signal charge transferred to the floating diffusion FD is converted by the amplifier transistor SF into the potential of the floating diffusion FD.

The potential of the floating diffusion FD is obtained by the CDS as the potential corresponding to the potential difference between the floating diffusion FD to which the signal charge has been transferred from the photodiode PD and the floating diffusion FD that is reset.

The reset state of the floating diffusion FD refers to a dark level (black level) state in which the reset transistor is turned on to connect the floating diffusion FD to the drain power supply of the reset transistor, and the accumulated charges are discharged from the floating diffusion FD.

The methods for resetting the floating diffusion FD include soft reset and hard reset.

In soft reset, the reset potential of the floating diffusion FD has not reached the drain source voltage of the reset transistor. In hard reset, the reset potential of the floating diffusion FD becomes equal to the potential of the drain source voltage of the reset transistor.

When the floating diffusion FD is soft reset, the reset potential changes at each reset operation and some noise components remain unremoved by the CDS. When the floating diffusion FD is hard reset, the reset potential of the floating diffusion FD becomes equal to the potential of the drain source voltage of the reset transistor as described above. As a result, noise components can be eliminated.

In order to hard reset the floating diffusion, there is a method in which the threshold value of the reset transistor is made lower than the threshold values of other transistors such as the amplifier transistor in the pixel. Particularly in such a method, the threshold value of the reset transistor is completely made a negative voltage value, i.e., the reset transistor operates as a depression transistor.

Accordingly, when the reset transistor is ON, the surface potential of the gate of the reset transistor can be sufficiently reduced, which enables the potential of the floating diffusion to be equal to the drain source voltage, i.e., the reset transistor is hard reset when the reset transistor is turned on.

This method, however, necessitates an additional process for setting the threshold value, which increases the number of processes for manufacturing a semiconductor, thus leading to an increase in cost.

To avoid such a situation, another method is used in which the drain power supply of the reset transistor is separate from the power supply such as the amplifier transistor to make the drain source voltage of the reset transistor lower than the source voltage of the amplifier transistor. This advantageously reduces the back-bias effect and enables the reset transistor to be hard reset.

When the drain source voltage of the reset transistor is made lower than the source voltage of the amplifier transistor to hard reset the reset transistor, the fixed pattern noise increases.

The fixed pattern noise is likely generated by defects in the silicon interface or leakage of electrical charge from the silicon interface in the channel of the transfer transistor, which is described later.

The fixed pattern noise is an offset of output from a specific pixel on each image-capturing operation in a pixel array on which a plurality of pixels is arranged.

That is, the fixed pattern noise causes the "black level" or "white level" according to the output from the pixel to deviate from the standard average level, so that defective images are produced in which dots or linear streaks appear.

Further, the photodiode PD of each pixel generates and accumulates signal charges in proportion to the amount of light striking the photodiode PD. When the photodiode PD reaches a level of electrical charge saturation, the signal charges leak from the photodiode PD.

In an area surrounding the photodiode PD, the potential barrier of the channel of the transfer transistor TX is, for example, doped with ions to lower the potential in the channel of the transfer transistor. This enables the signal charges leaking from the saturation-level photodiode PD, to pass through the channel of the transfer transistor TX to be transferred to the floating diffusion FD. The electrical charges transferred to the floating diffusion FD are accumulated in the floating diffusion FD.

When the floating diffusion FD reaches the level of electrical charge saturation, the signal charges leak from the floating diffusion FD. The signal charges leaking from the floating diffusion FD might further leak to other photoelectric convertors PD or floating diffusion nodes in other pixels adjacent to the original pixel (pixel of the floating diffusion FD from which the signal charges leak), which means that a further improvement in an elimination or reduction of blooming is expected.

The solid-state image sensor 100 according to the embodiments of the present disclosure can eliminate or reduce the fixed pattern noise (FPN) and blooming to improve image quality.

First Embodiment

Figure 1:
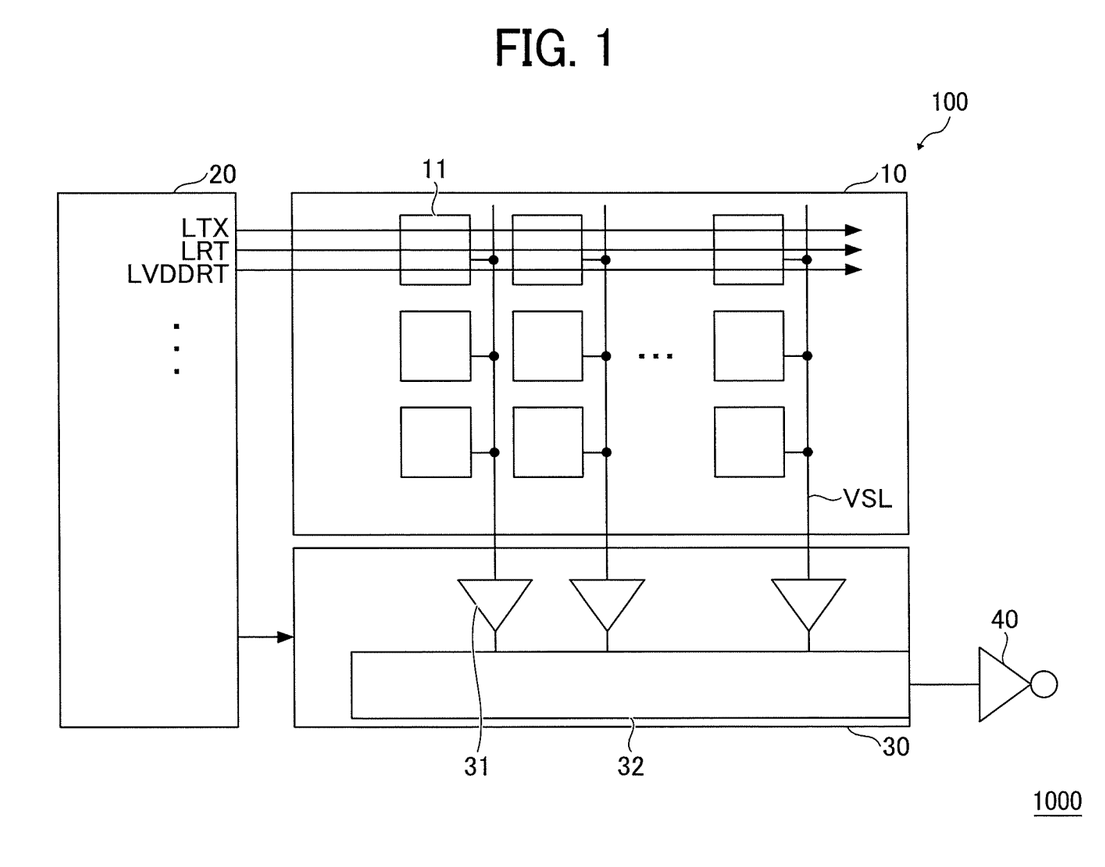
FIG. 1 is a schematic illustration of a solid-state image sensor according to an embodiment of the present disclosure.
Figure 2A:
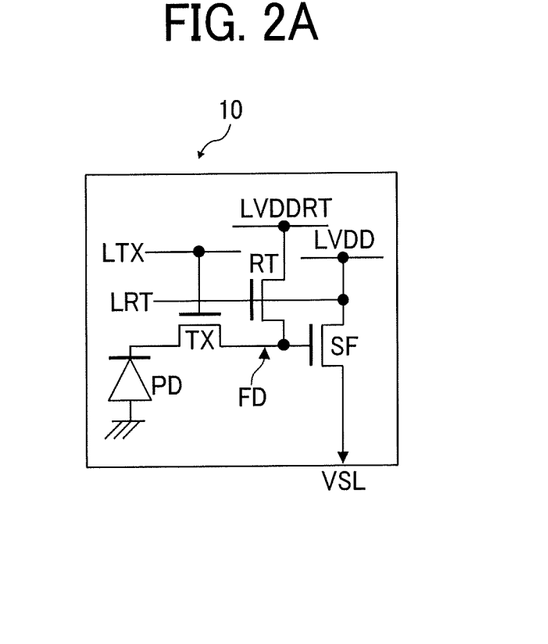
FIG. 2A is an equivalent circuit diagram of a pixel of the solid-state image sensing device of FIG. 1.

FIG. 1 is a schematic view of a solid-state image sensor 100 according to an embodiment of the present disclosure. FIG. 2A is an equivalent circuit diagram of a pixel 11 of the solid-state image sensor 100 according to an embodiment of the present disclosure.

As illustrated in FIG. 1, the solid-state image sensor 100 according to an embodiment of the present disclosure includes a pixel unit 10, a control circuit 20, a readout signal processor 30, and an output unit 40.

The pixel unit 10 includes a plurality of pixels 11 arranged in, for example, matrix.

As illustrated in FIG. 2A, the pixel 11 includes a photoelectric convertor such as a photodiode PD, the floating diffusion FD node, the transfer transistor TX, the reset transistor RT, and the amplifier transistor SF.

The pixel 11 further includes a power supply line VDD, a control line LTX of the transfer transistor TX, a control line LRT of the reset transistor RT, and a reset power supply control line LVDDRT, which are connected to a vertical signal line VSL.

The transfer transistor TX is provided between the photodiode PD and the floating diffusion FD as an output node.

The reset transistor RT is provided between the reset power supply control line LVDDRT and the floating diffusion FD.

The floating diffusion FD is connected to the gate of the amplifier transistor SF. The source and drain of the amplifier transistor SF are connected to the vertical signal line VSL and the power supply line LVDD, respectively and constitute a source follower.

As illustrated in FIG. 1, the control line LRT of the reset transistor RT, the control line LTX of the transfer transistor TX, and the reset power supply control line LVDDRT make a set of control lines, and the set of the control lines is wired for each row of the arranged pixels 11.

The control line LRT of the reset transistor RT, the control line LTX of the transfer transistor TX, and the reset power supply control line LVDDRT are connected to the control circuit 20.

The control circuit 20 controls the potentials through the control line LRT of the reset transistor RT, the control line LTX of the transfer transistor TX, and the reset power supply control line LVDDRT. Further, the control circuit 20 is connected to the read signal processor 30.

The vertical signal line VSL of the pixel unit 10 is connected to the read signal processing portion 30. The read signal processor 30 includes an analog-digital convertor 31 (or analog amplifier) as a circuit for reading out a pixel signal and a data transmitter 32.

The read signal processor 30 is connected to the output unit 40. The output unit 40 includes an output amplifier that outputs analog data, used for analog signal processing by the read signal processor 30 or a differential amplifier circuit that outputs digital data, used for digital signal processing (digitization) by, for example, an AD converter.

In the pixel 11 of the solid-state image sensor 100, when exposed to light, the photodiode PD converts the light into an electrical charge stored in the photodiode PD.

When the control circuit 20 supplies a drive signal to the gate of the transfer transistor TX through the control line LTX of the transfer transistor TX, the signal charge accumulated in the photodiode PD is transferred to the floating diffusion FD through the transfer transistor TX.

When the control circuit 20 supplies a drive signal to the gate of the reset transistor RT through the control line LRT of the reset transistor RT, the potential at the floating diffusion node FD is reset by the potential of the reset power supply control line LVDDRT. The amplifier transistor SF outputs a voltage (read signal) corresponding to the potential of the floating diffusion FD to the vertical signal line VSL.

To obtain the potential of the floating diffusion FD, the amplifier transistor SF reads out the potential of the floating diffusion FD to which the signal charges have been transferred from the photodiode PD and the potential of the floating diffusion FD that is reset.

Then, the read signal processor 30 obtains a potential difference between the floating diffusion FD to which the signal charges have been transferred from the photodiode PD and the reset floating diffusion FD, using the CDS. Subsequently, the output unit 40 outputs the potential difference as an image signal.

In the above-described operation, the control circuit 20 supplies power supply potential to the pixel 11 and drives each transistor. Further, the control circuit 20 also drives the read signal processor 30.

Figure 2B:
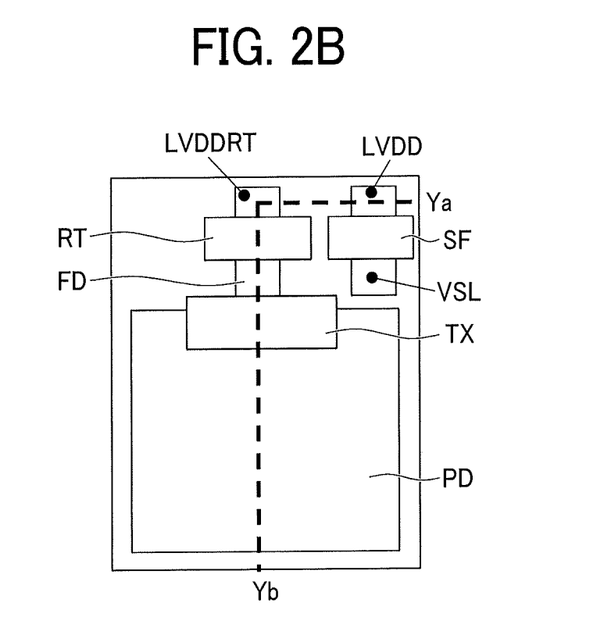
FIG. 2B is a plan view of the pixel of FIG. 2A.

FIG. 2B is a plan view of the pixel 11 of the solid-state image sensor 100 according to an embodiment of the present disclosure. As illustrated in FIG. 2B, for example, the pixel area of the silicon semiconductor substrate is separated into a well and a separated area, to form the photodiode PD.

The gate of the transfer transistor TX is provided on one side of the photodiode PD, and the floating diffusion FD is provided next to the gate of the transfer transistor TX, on the side opposite the photodiode PD side.

The gate of the reset transistor RT is provided on one side of the floating diffusion FD.

A reset power supply connection area is provided next to the gate of the reset transistor RT, on the side opposite the floating diffusion FD side. The reset power supply control line LVDDRT is connected to the reset power supply connection area.

In the semiconductor substrate, the amplifier transistor SF is disposed on another area other than the areas of the photodiode PD and the floating diffusion FD.

The gate of the amplifier transistor SF is connected to the floating diffusion FD through, for example, an upper-layer wiring.

In the semiconductor substrate, a power supply connection area is provided at one side of the amplifier transistor SF, to connect to the power supply line LVDD, and a vertical signal line connection area is provided at the other side of the amplifier transistor SF to connect to the vertical signal line VSL.

Next, a description is given of the timing of operation of the pixel 11 in the solid-state image sensor 100.

Figure 3:
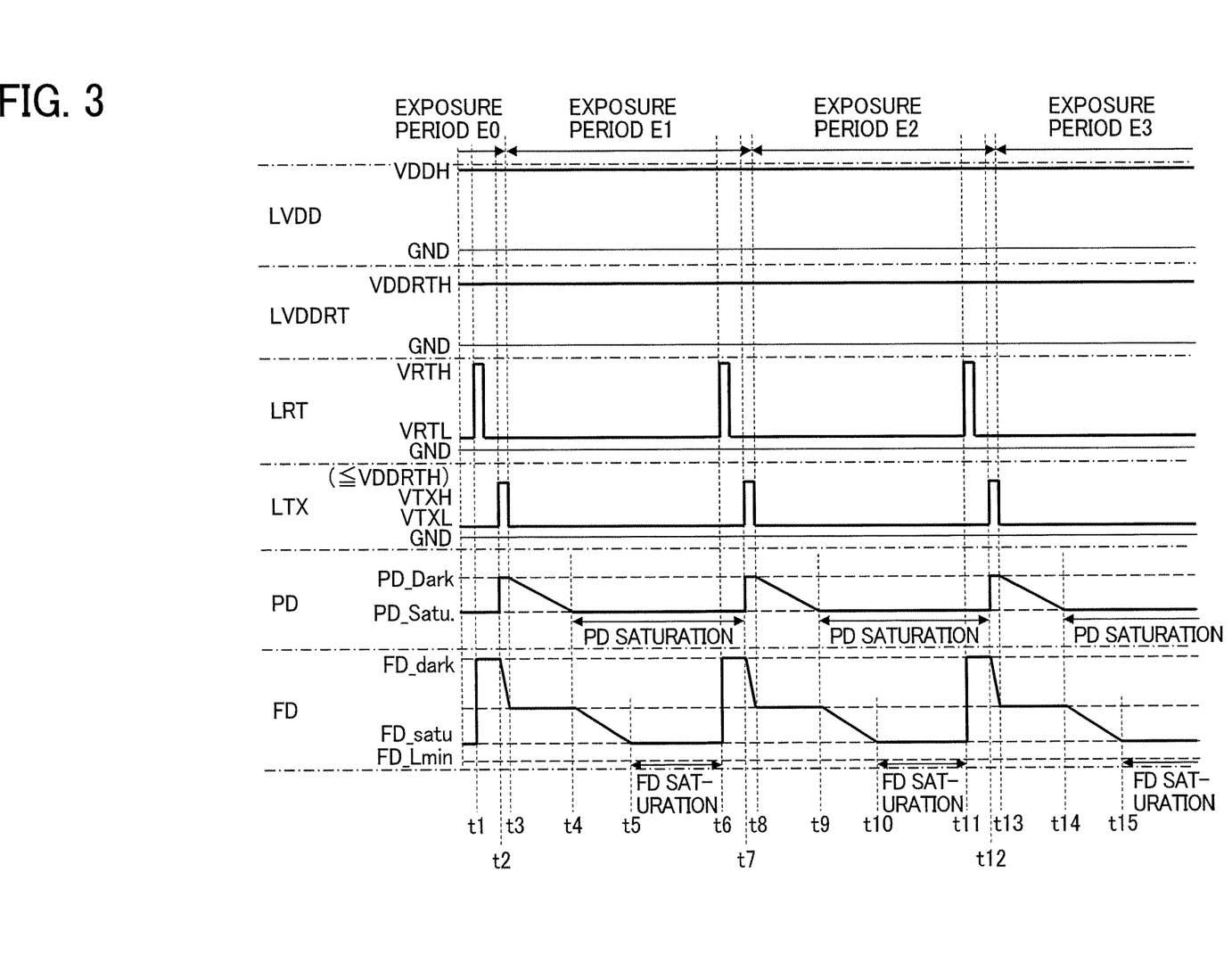
FIG. 3 is a timing chart of each signal of the solid-state image sensing device of FIG. 1.

FIG. 3 is a timing chart of each signal of the solid-state image sensor 100 according to the embodiment of the present disclosure.

In the timing chart of FIG. 3, a pixel reset operation, a pixel-signal reading operation, and a pixel reading operation are performed multiple times. During the exposure time, the pixel 11 is exposed to light with an intensity to reach the charge saturation level of the photodiode PD and the floating diffusion FD.

The control circuit 20 supplies a voltage VDDH to the power supply line LVDD, and a voltage VDDRTH to the reset power supply control line LVDDRT. The voltage VDDH and the voltage VDDRTH are both constant. The voltage VDDRTH of the reset power supply control line LVDDRT is supplied as the drain source voltage of the reset transistor RT, and set lower than the voltage VDDH that is the highest source voltage of the pixel.

Accordingly, as described later, when the reset transistor RT is ON, the reset potential of the floating diffusion FD becomes equal to the voltage VDDRTH of the reset power supply control line LVDDRT, so that the floating diffusion FD becomes hard reset.

In the time periods of the pixel reset and the pixel signal reading, the control line LRT of the reset transistor RT and the control line LTX of the transfer transistor TX are controlled by pulse signals generated by the control circuit 20 to read out the signals of the pixel.

First, the floating diffusion FD is reset at time t1. As a reset operation, the control circuit 20 applies a pulse ON voltage (voltage VRTH) to the gate of the reset transistor RT through the control line LRT of the reset transistor RT, to turn on the reset transistor RT.

As a result, the floating diffusion FD is connected to the reset power supply control line LVDDRT, and the electrical charges in the floating diffusion FD are discharged to the reset power supply control line LVDDRT.

That is, the potential of the floating diffusion FD is reset to the potential of the reset power supply control line LVDDRT.

Next, the control circuit 20 applies an OFF voltage (voltage VRTL) is applied to the gate of the reset transistor RT through the control line LRT of the reset transistor RT, to turn off the reset transistor RT. As a result, the floating diffusion FD is disconnected from the reset power supply control line LVDDRT, so that the reset potential of the floating diffusion FD is determined.

At time t2, the signal charges generated and accumulated in the photodiode PD are transferred to the floating diffusion FD. As the transfer operation, the control circuit 20 applies a pulse ON voltage (voltage VTXH) to the gate of the transfer transistor TX through the control line LTX of the transfer transistor TX, to turn on the transfer transistor TX.

As a result, the signal charges accumulated in the photodiode PD are completely transferred to the floating diffusion FD through the transfer transistor TX during the exposure time E0.

Subsequently, at time t3, the control circuit 20 applies an OFF voltage (voltage VTXL) to the gate of the transfer transistor TX through the control line LTX of the transfer transistor TX, to turn off the transfer transistor TX.

As a result, the floating diffusion FD is disconnected from the photodiode PD, so that the potential of the signal level of the floating diffusion FD is determined. At time t3, the exposure time E0 until the time t3 ends, and the next exposure time E1 starts.

In the above, the voltage VTXH (first voltage) applied to the gate of the transfer transistor TX when the transfer transistor TX is turned on, is set less than or equal to the drain source voltage (voltage VDDRTH (second voltage)) of the reset transistor RT, so as to eliminate or reduce the fixed pattern noise.

In the reset time, that is, the time periods other than the pixel signal reading time, the control circuit 20 continues applying an OFF voltage (voltage VRTL) to the gate of the reset transistor RT through the control line LRT of the reset transistor RT, to turn off the reset transistor RT.

Further, the control circuit 20 continues applying an OFF voltage (voltage VTXL) to the gate of the transfer transistor TX through the control line LTX of the transfer transistor TX, to turn off the transfer transistor TX.

In the above description, each of the voltage VTXL (third voltage) and the voltage VRTL (fourth voltage) is set to a voltage higher than the ground GND voltage. The voltage VTXL (third voltage) is applied to the gate of the transfer transistor TX when the transfer transistor TX is OFF, and the voltage VRTL (fourth voltage) is applied to the gate of the reset transistor when the reset transistor RT is OFF. This configuration can eliminate or reduce blooming.

When the signal charges are transferred at time t2 to the floating diffusion FD with the transfer transistor TX turned on, the photodiode PD has a potential PD_Dark at which no charge is stored in the photodiode PD.

When the signal charges are completely transferred to the transfer transistor TX and the transfer transistor TX is turned off at time t3, a new exposure time E1 starts. When the exposure time E1 start, the photodiode PD starts accumulating newly generated signal charges therein and the potential at the photodiode PD gradually decreases.

In a short time, the photodiode PD reaches saturation, for example, at time t4, and the potential PD_Satu. of the photodiode PD remains constant until time t7. After the photodiode PD is saturated with the signal charges, the signal charges newly generated by the photodiode PD leaks from the photodiode PD.

In the present embodiment, the OFF voltage (voltage VTXL) to be applied to the gate of the transfer transistor TX is set higher than the ground GND voltage.

This enables the signal charges leaking from the photodiode PD that has reached saturation level to leak to the floating diffusion FD while preventing the signal charges from leaking to another pixel adjacent to the original pixel (pixel of the photodiode PD from which the electrical charges are leaking).

The floating diffusion FD is reset at time t1 to have the reset potential FD_Dark. When the signal charges are completely transferred from the photodiode PD at time t3, the floating diffusion FD has a signal level potential.

In a short time, the photodiode PD reaches saturation, for example, at time t4 and the signal charges leak from the photodiode PD to the floating diffusion FD. Then, the potential of the floating diffusion FD gradually decreases.

For example, the photodiode PD reaches saturation at time t5 and the potential remains constant at the potential FD_Satu. After the floating diffusion FD reaches saturation, the signal charges leak from the floating diffusion FD.

In the present embodiment, the OFF voltage (voltage VTXL) to be applied to the gate of the reset transistor RT is set higher than the ground GND voltage. Further, the surface potential in the channel area under the gate of the reset transistor when the reset transistor RT is OFF is lower than the surface potential in the channel area under the gate of the transfer transistor TX when the transfer transistor TX is off. That is, the channel area under the gate of the reset transistor that is OFF has a potential higher than the potential of the channel area under the gate of the transfer transistor TX that is OFF.

With such a configuration, the signal charges leaking from the saturation-level floating diffusion FD are discharged to the reset power supply control line LVDDRT of the reset transistor RT without leaking to another pixel adjacent to the original pixel.

In FIG. 3, the potential FD_Lmin refers to a potential of the saturation-level floating diffusion FD when the GND voltage is applied as the OFF voltage VRTL to the reset transistor RT.

When the electrical charges fail to be discharged from the floating diffusion FD to the reset power supply control line LVDDRT, the maximum amount of signal charges are accumulated in the floating diffusion FD so that the floating diffusion FD reaches the potential FD_Lmin.

The signal charges leaking from the floating diffusion FD of the potential FD_Lmin are not discharged to the reset power supply control line LVDDRT of the reset transistor RT, and flow to the photoelectric convertors PD and the floating diffusions FD of another pixel adjacent to the original pixel.

However, with the configuration according to the present embodiment, the floating diffusion FD does not reach the potential FD_Lmin, and the signal charges leaking from the floating diffusion FD are discharged to the reset power supply control line LVDDRT of the reset transistor RT.

In the exposure time E1, when the reset transistor RT is turned on and the floating diffusion FD is reset at time t6, the floating diffusion FD has the reset potential.

At time t7 of the exposure time E1, the signal charges accumulated in the photodiode PD are transferred to the floating diffusion FD. When the signal chares are completely transferred to the floating diffusion FD and the transfer transistor TX is turned off at time t8, the exposure time E1 ends and the exposure time E2 starts. After the signal charges are completely transferred to the floating diffusion FD, the floating diffusion FD has the signal-level potential.

Thereafter, the photodiode PD reaches saturation at time t9, and the floating diffusion FD reaches saturation at time t10. Then, the signal charges leaking from the photodiode PD flow to the floating diffusion FD, and the signal charges leaking from the floating diffusion FD are discharged to the reset power supply control line LVDDRT.

Thereafter, the floating diffusion FD is reset at time t11 in the exposure time E2, and the signal charges accumulated in the photodiode PD are transferred to the floating diffusion FD at time t12 in the exposure time E2. Subsequently, the signal chares are completely transferred to the floating diffusion FD, the exposure time E2 ends, and the exposure time E3 starts at time t13.

Same as in the exposure time E3, the photoelectric convertor reaches saturation at time t14, and the floating diffusion FD reaches saturation at time t15.

Figure 4:
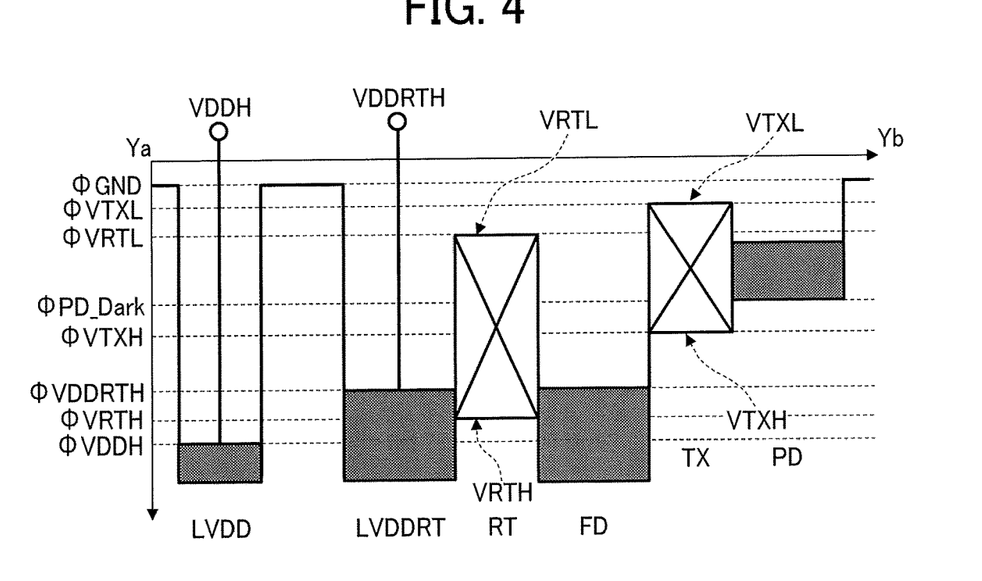
FIG. 4 is a graph of the potential of the pixel in the solid-state image sensor of FIG. 1.

FIG. 4 is an illustration of surface potentials in the pixel 11 of the solid-state image sensor 100 according to an embodiment of the present disclosure. The potentials in FIG. 4 corresponds to the surface potentials at the cross-sectional area taken along the dotted line Ya-Yb illustrated in FIG. 2B. The connection area of the power supply line LVDD and the connection area of the reset power supply control line LVDDRT are arranged in that order from the point Ya to the point Yb.

Further, the channel area under the gate of the reset transistor RT, the floating diffusion FD, the channel area under the gate of the transfer transistor TX, and the photodiode PD are arranged side by side.

As described above, the voltage VDDH, which is highest in the pixel, is supplied to the connection area of the power supply line LVDD, and the voltage VDDRTH, which is lower than the voltage VDDH, is supplied to the connection area of the reset power supply control line LVDDRT. Each of the voltage VDDH and the voltage VDDRTH is constant.

The expression "$\Phi$ VDDH" denotes the potential of the connection area of the power supply line LVDD when the voltage VDDH is applied to the connection area of the power supply line LVDD. The expression "$\Phi$ VDDRTH" denotes the potential of the connection area of the reset power supply control line LVDDRT when the voltage VDDRTH is applied to the connection area of the reset power supply control line LVDDRT.

That is, $\Phi$ VDDH is lower than $\Phi$ VDDRTH, that is, the electrical potential of connection area of the power supply line LVDD is higher than the potential of the connection area of the reset power supply control line LVDDRT.

When the reset transistor RT is reset, the ON voltage VRTH is applied to the gate of the reset transistor RT. The expression "$\Phi$ VRTH" denotes the potential in the channel area under the gate of the reset transistor RT when the voltage VRTH is applied to the gate of the reset transistor RT.

In the present embodiment, the ON voltage VRTH of the reset transistor RT is set such that $\Phi$ VRTH in the channel area under the gate of the reset transistor RT is equal to the potential between $\Phi$ VDDH and $\Phi$ VDDRTH when the reset transistor RT is ON.

For example, the voltage VDDH may be used as the voltage VRTH. Alternatively, a voltage stepped down from the voltage VDDH may be used as the voltage VRTH.

The voltage VDDRTH of the reset power supply control line LVDDRT is adjusted to be lower than the voltage VDDH of the power supply line LVDD. Accordingly, $\Phi$ VRTH is adjustable to a potential between $\Phi$ VDDH and $\Phi$ VDDRTH as described above.

This configuration enables the surface potential of the reset floating diffusion FD to be $\Phi$ VDDRTH, which enables the floating diffusion FD to be hard reset.

A description is given of the voltage VTXH of the gate of the transfer transistor TX in reading out a pixel signal. During the transfer of the electrical charges, the ON voltage VTXH is applied to the gate of the transfer transistor TX.

The expression "$\Phi$ VTXH" denotes the potential in the channel area under the gate of the transfer transistor TX when the voltage VTXH is applied to the gate of the transfer transistor TX.

In the present embodiment, the ON voltage VTXH of the transfer transistor TX is set such that $\Phi$ VDDRTH (surface potential) is lower than or equal to $\Phi$ VTXH, that is, $\Phi$ VDDRTH (electrical potential) is higher than or equal to $\Phi$ VTXH ($\Phi$ VDDRTH $\Phi$ VTXH).

For example, a voltage stepped down from the voltage VDDH may be used as the voltage VTXH.

The above-described configuration of the solid-state image sensor 100 according to an embodiment of the present disclosure enables the floating diffusion FD to be hard reset using the reset transistor RT.

When the floating diffusion FD is hard reset, the electrical charges transferred from the photodiode PD to the floating diffusion FD are prevented from returning to the photodiode PD and the channel area under the gate of the transfer transistor TX due to the relation that P VDDRTH is higher than or equal to $\Phi$ VTXH.

This configuration can reduce the concentration of electrons in the channel area under the gate of the transfer transistor TX, and eliminates or prevents the influence of defects of the silicon interface or leaks of electrical charges from the silicon interface. Thus, the fixed pattern noise can be eliminated or reduced. When the relation that $\Phi$ VDDRTH is lower than or equal to $\Phi$ VTXH is satisfied, the concentration of electrons in the channel area under the gate of the transfer transistor TX increases, and the fixed pattern noise increases due to the influence of, for example, the defects of the silicon interface.

Next, a description is given of operations other than the operations in resetting and reading pixel signals. The expression "$\Phi$ VRTL" denotes the potential in the channel area under the gate of the reset transistor RT when the OFF voltage VRTL is applied to the gate of the reset transistor RT.

The expression "$\Phi$ VTXL" denotes the potential in the channel area under the gate of the transfer transistor TX when the OFF voltage VTXL is applied to the gate of the transfer transistor TX. The voltages VRTL and VTXL are set such that $\Phi$ VRTL and $\Phi$ VTXL are lower than the surface potential $\Phi$ GND of the ground GND, that is, each of $\Phi$ VRTL and $\Phi$ VTXL (electrical potential in this case) is higher than $\Phi$ GND ($\Phi$ VRTL>$\Phi$ GND, $\Phi$ VTXL>$\Phi$ GND).

For example, the voltage VRTL and the voltage VTXL are set higher than the ground GND.

Further, the voltages VRTL and VTXL are adjusted such that $\Phi$ VRTL (surface potential) is lower than $\Phi$ VTXL (surface potential), that is, $\Phi$ VRTL (electrical potential) is higher than $\Phi$ VTXL (electrical potential) ($\Phi$ VRTL>$\Phi$ VTXL).

As described above, the relations are satisfied that Φ VRTL is greater than Φ VTXL and Φ VTXL is greater than Φ GND (Φ VRTL>Φ VTXL>Φ GND). Note that the photodiode PD is isolated from other pixel elements by an element isolation insulating film or well, except for a portion in contact with the transfer transistor TX.

With the relation that Φ VTXL is greater than Φ GND, the signal charges leaking from the photodiode PD that has reached the saturation level can be discharged to the floating diffusion FD without flowing to another pixel adjacent to the original pixel.

Further, Φ VRTL is greater than Φ VTXL. With such a relation satisfied, the signal charges leaking from the photodiode PD that has reached the saturation level can be discharged to the reset power supply control line LVDDRT of the reset transistor RT without flowing to another pixel adjacent to the original pixel (pixel of the photodiode PD from which the electrical charges are leaking).

That is, the signal charges leaking from the photodiode PD and the floating diffusion FD can be prevented from leaking to the photodiode PD and the floating diffusion FD in another pixel adjacent to the original pixel. Thus, blooming can be prevented.

Figure 5:
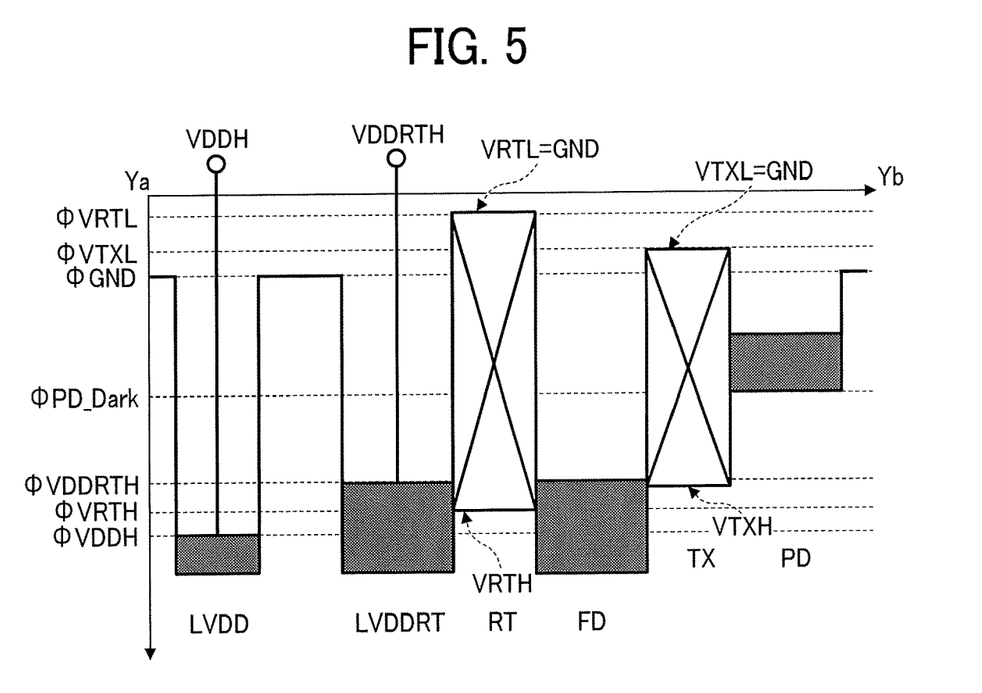
FIG. 5 is a graph of the potential of a pixel of a solid-state image sensor according to a comparative example.

FIG. 5 is a graph of the potential of the pixel 11 in the solid-state image sensor 100 according to a comparative example.

As illustrated in FIG. 5 according to the comparative example, the voltage VRTL is equal to the voltage VTSL, and the voltage VTSL is equal to the GND voltage. In the comparative example, Φ VRTL is less than Φ VTXL and Φ VTXL is less than Φ GND.

The signal charges leaking from the photodiode PD are more likely to leak to another pixel adjacent to the original pixel, instead of flowing to the floating diffusion FD through the transfer transistor TX. In the case in which the signal charges leaking from the saturation-level photodiode PD are successfully discharged to the floating diffusion FD, the signal charges are still less likely to be discharged to the reset power supply control line LVDDRT through the reset transistor RT when the floating diffusion FD reaches saturation.

For this reason, the signal charges leaking from the floating diffusion FD easily leak to another pixel adjacent to the original pixel. The configuration according to the comparative example disadvantageously causes the signal charges leaking from the saturation-level element to leak to another pixel adjacent to the original pixel. That is, the configuration according to the comparative example hampers the elimination or reduction of blooming.

Using a method for manufacturing the solid-state image sensor 100 according to an embodiment of the present disclosure, for example, the reset transistor RT and the amplifier transistor SF can be formed by the same semiconductor process. That is, the method according to an embodiment of the present disclosure can produce the transistors without an increase in the number of processes of the semiconductor processing.

The other processes are the same as those of the typical CMOS processing, except that the gate voltage of the transfer transistor TX, the gate voltage of the reset transistor RT, and the voltage of the reset power supply control line LVDDRT are set as described above.

The solid-state image sensor according to the embodiments of the present disclosure can eliminate or reduce the fixed pattern noise and blooming, and improve image quality.

Examples

In this Example, the electron distribution in the cross section of the pixel when the gate of the transfer transistor TX is turned on is obtained using device simulation for the solid-state image sensors according to the present example and the comparative example.

Figure 6:
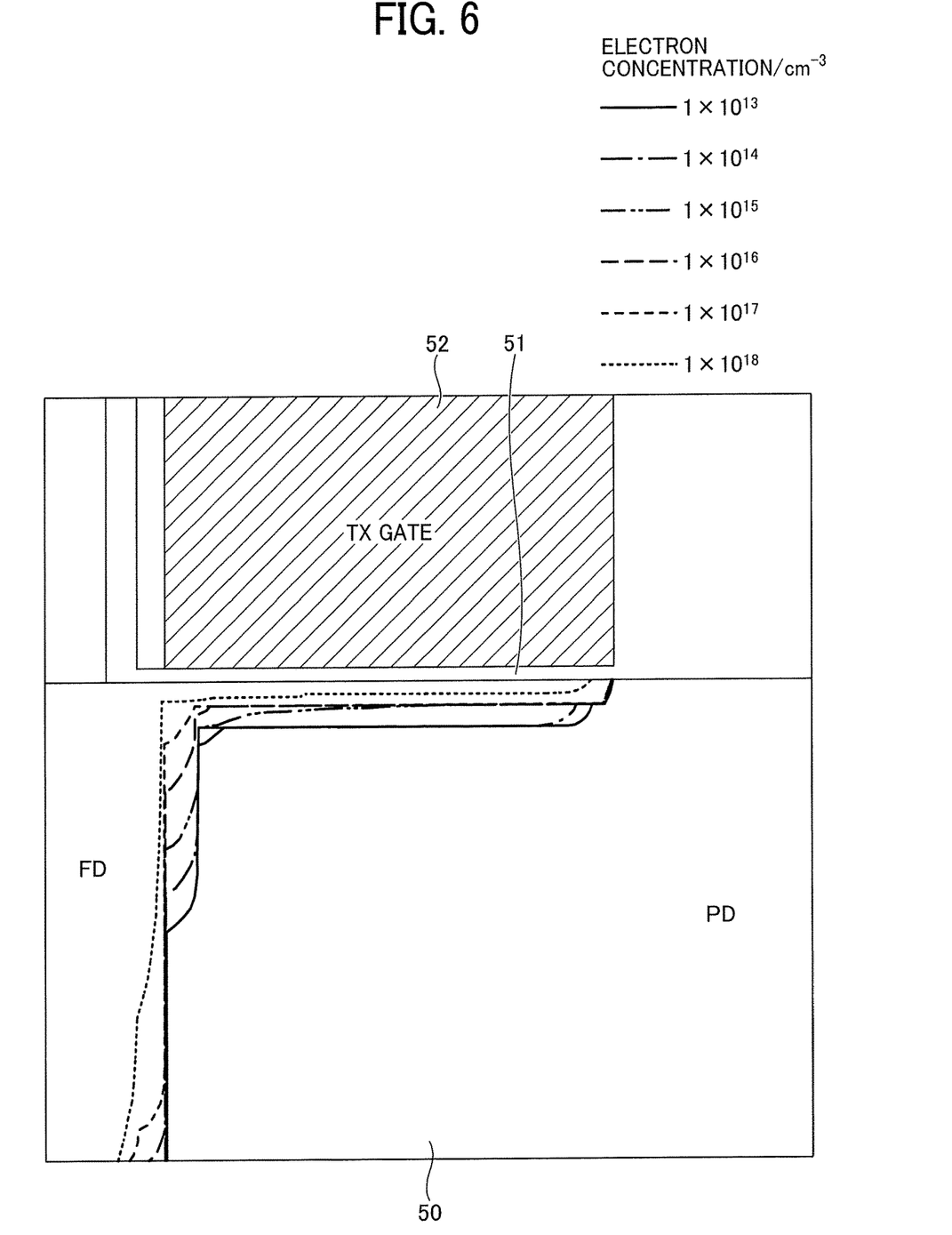
FIG. 6 is an illustration of electron distribution of a solid-state image sensor according to another comparative example.

FIG. 6 is a diagram illustrating the electron distribution when the transfer transistor TX of the solid-state image sensor according to the comparative example is ON.

Figure 7:
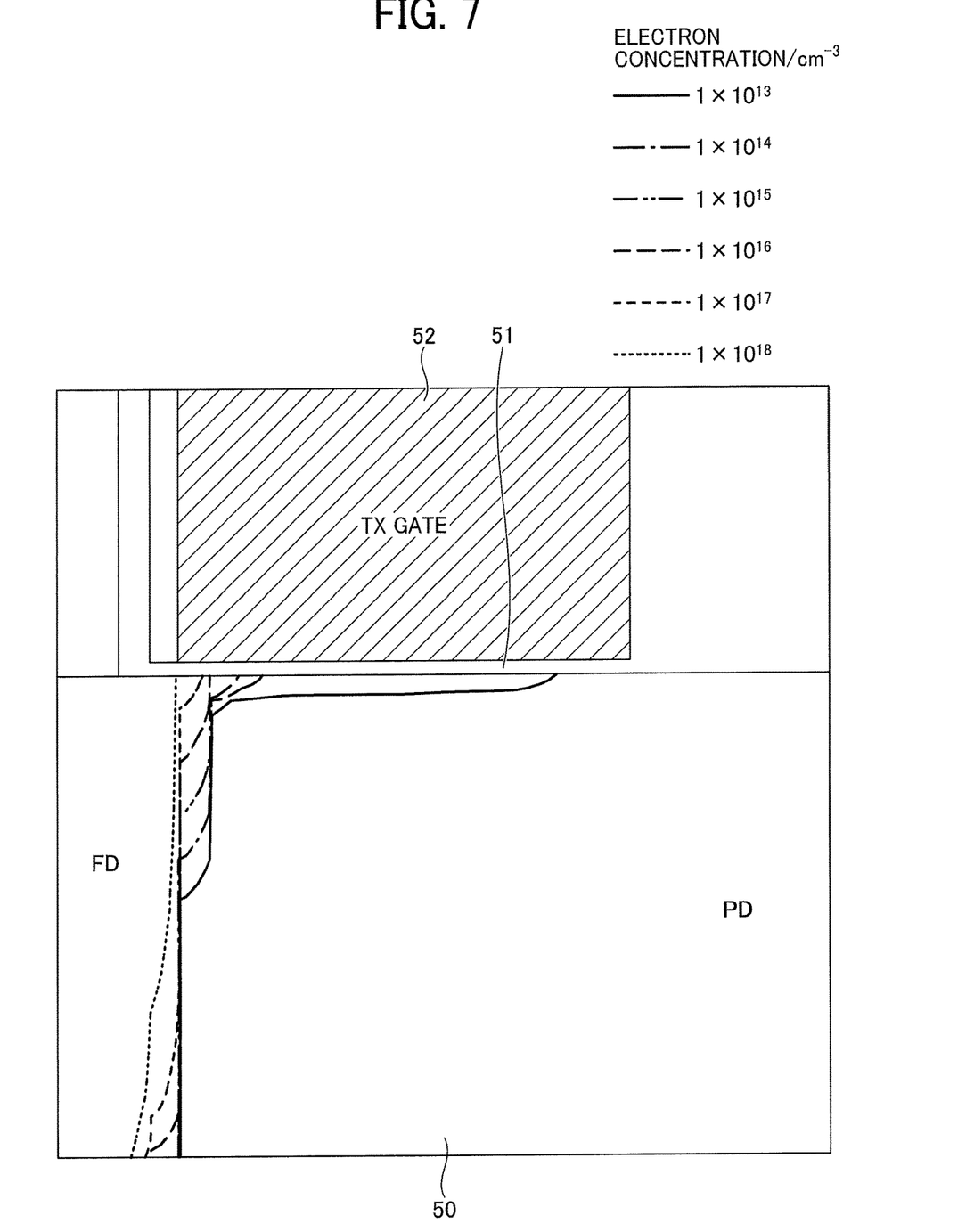
FIG. 7 is an illustration of electron distribution of a solid-state image sensor according to an example of the present disclosure.

FIG. 7 is a diagram illustrating the electron distribution when the transfer transistor TX of the solid-state image sensor 100 according to the present Example is ON.

The device simulation were performed assuming that the solid-state image sensor according to the comparative example in FIG. 6 and the solid-state image sensor 100 according to the present Example in FIG. 7 have the same device structure.

Each semiconductor substrate 50 in FIGS. 6 and 7 has a device structure in which a well, a separation area, the photodiode PD, the gate insulating film 51 and the gate electrode 52 of the floating diffusion FD and the transfer transistor TX are provided.

In order to observe the transient state of each solid-state image sensor, the device simulation was started with the gate voltage of the transfer transistor TX being OFF (i.e., the GND voltage) and terminated when the gate voltage becomes ON (i.e., the voltage VTXH), with changes in the gate voltage of the transfer transistor TX.

In the solid-state image sensor according to the comparative example in FIG. 6, the gate voltage when the transfer transistor TX is turned on, is voltage VTXH of 3.3 V (volt) that is higher than voltage VDDRTH of 2.7 V.

In the solid-state image sensor according to the present example in FIG. 7, the gate voltage when the transfer transistor TX is turned on, is voltage VTXH of 2.5 V (volt) that is lower than voltage VDDRTH of 2.7 V.

In FIGS. 6 and 7, the concentration distribution for each order of from the electron concentration of $1 \times 10^{13}/cm^{-3}$ to $1 \times 10^{18}/cm^{-3}$ is indicated by a different kind of line.

As illustrated in FIGS. 6 and 7, electrons are distributed around the floating diffusion FD and the channel region under the gate electrode 52 of the transfer transistor TX.

When the channel areas under the gate electrode 52 of the transfer transistor TX are compared between FIG. 6 and FIG. 7, in the comparative example of FIG. 6, electrons in an electron concentration of $1 \times 10^{18}$ cm$^{-3}$ remains in an area close to the interface between the channel area and the gate insulating film 51 of the semiconductor substrate 50. As can be seen from FIG. 6, the electrons are distributed to an area in the vicinity of the photodiode PD of the channel area.

In contrast, in the present Example of FIG. 7, only electrons in a concentration of approximately $1 \times 10^{13}$ cm$^{-3}$ or less remain in the channel area under the gate electrode 52, and the electron concentration of the channel area under the gate electrode 52 is very weak. Further, the distribution area of the present Example is smaller than the distribution area of the comparative example.

The following can be deduced from the above-described device simulations: When the gate voltage when the transfer transistor TX is turned on, is the voltage VTXH of 3.3 V higher than the voltage VDDRTH of 2.7 V, as in the comparative example, the potential of the channel area under the gate electrode 52 of the transfer transistor TX becomes higher than the floating diffusion FD when the transfer transistor TX is turned on.

The present inventor has considered that such phenomenon is more likely to occur due to a reduction in the voltage VDDDRTH to hard reset the floating diffusion FD.

With such a phenomenon, the electrical charges leak from the floating diffusion FD and flow to the channel area under the gate of the transfer transistor TX. The flow range extends to the end of the channel area on the photodiode PD side.

Accordingly, the interface between the gate insulating film and the channel area of the transfer transistor TX are damaged or the electrical charges are leaked from the interface. This hampers the elimination or reduction of the fixed pattern noise.

By contrast, in the present Example, when the gate voltage when the transfer transistor TX is turned on, is the voltage VTXH of 2.5 V lower than the voltage VDDRTH of 2.7 V, the potential of the floating diffusion FD decreased due to the decrease in the voltage VTXH as compared to the voltage VDDRTH.

However, when the transfer transistor TX is turned on, Φ VTXH in the channel area under the gate electrode 52 of the transfer transistor TX was prevented from becoming lower than the potential (Φ VDDRTH immediately after reset of the floating diffusion FD) of the floating diffusion FD.

That is, Φ VTXH was prevented from being higher than Φ VDDRTH. The present inventor has found that such a phenomenon prevents the electrical charges from leaking out of the floating diffusion FD to the channel area under the gate of the transfer transistor TX. The present inventor further has found that such prevention can reduce damage to the interface between the gate insulating film and the channel area of the transfer transistor TX and prevent the electrical charges from leaking out from the interface. Thus, fixed pattern noise is eliminated or reduced so that image quality is improved.

Second Embodiment

Figure 8:
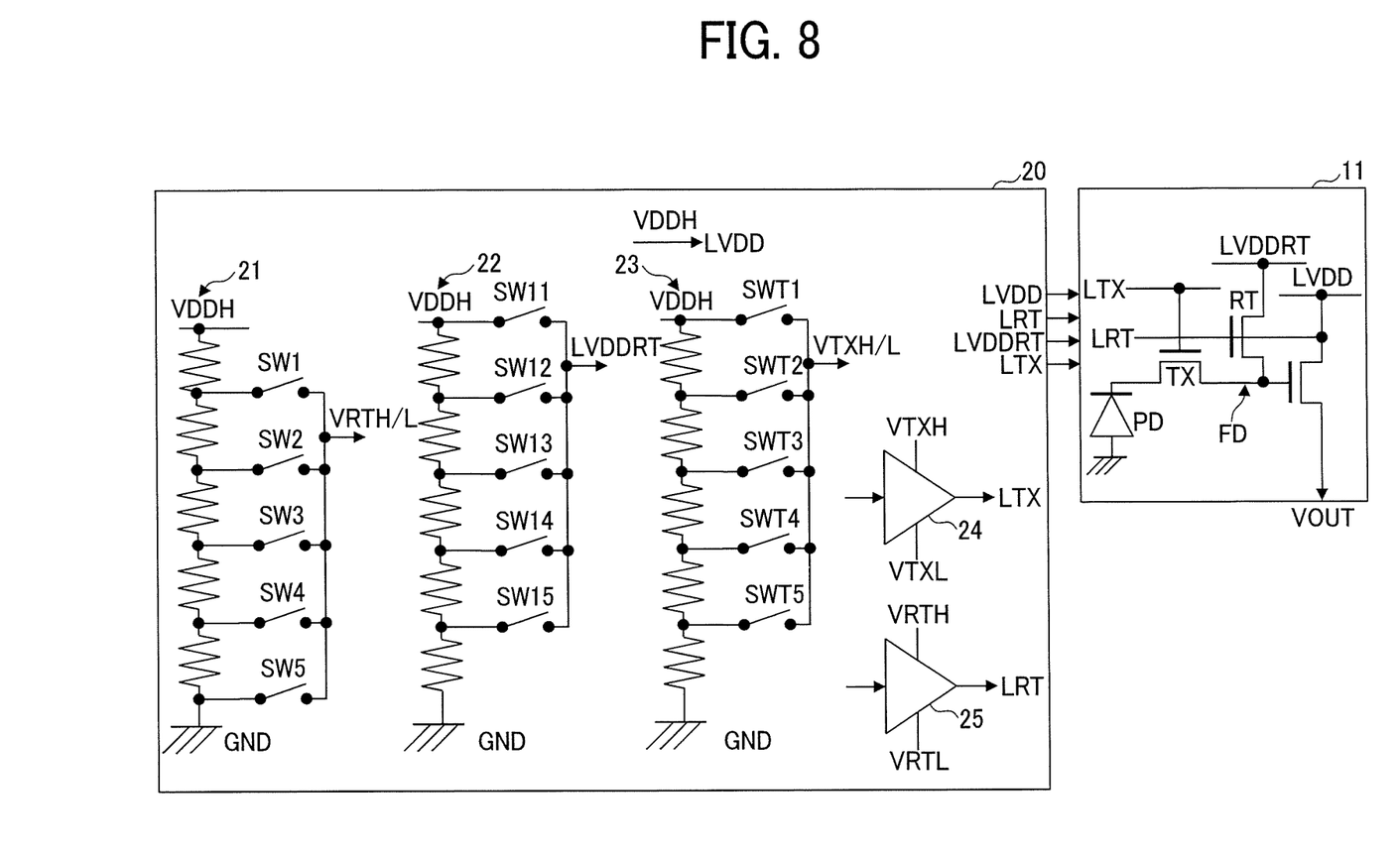
FIG. 8 is an illustration of a control circuit diagram of a solid-state image sensor according to an embodiment of the present disclosure and a schematic configuration of a pixel according to an embodiment of the present disclosure.

FIG. 8 is an illustration of a control circuit diagram of a solid-state image sensor according to an embodiment of the present disclosure and a schematic configuration of a pixel according to an embodiment of the present disclosure. In this second embodiment, the control circuit 20 according to the first embodiment as illustrated in FIG. 1 further includes a voltage adjustment circuit.

As illustrated in FIG. 8, the control circuit 20 is connected to the pixel 11 through each of a power supply line LVDD, a control line LRT of the reset transistor RT, a reset power supply control line LVDDRT, and a control line LTX of the transfer transistor TX.

The voltage VDDH, which is the highest source voltage of the pixel, is supplied to the power supply line LVDD.

Further, the control circuit 20 includes a plurality of resistors 21 connected in series in a ladder form between the power supply line LVDD, through which the voltage VDDH is applied to the pixel 11, and the ground GND. The connection positions of the resistors are switched by switches SW1 to SW5 made of transistors to obtain a voltage stepped down from the voltage VDDH by resistance of a predetermined number of resistors.

The obtained voltage is supplied as the ON voltage (the voltage VRTH) of the reset transistor RT or the OFF voltage (the voltage VRTL (the fourth voltage)), to the control line LRT of the reset transistor RT.

For example, when the switch SW1 is turned on, the voltage stepped down by a resistance of one resistor is supplied to the control line LRT of the reset transistor RT. When the switch SW2 is turned on, the voltage stepped down by resistances of two resistors is supplied to the control line LRT of the reset transistor RT.

For example, the voltage VRTH and the voltage VRTL are input to the pulse control logic circuit 25, and one of the voltage VRTH and the voltage VRTL is output to the control line LRT of the reset transistor RT.

As the voltage VRTH, the voltage VDDH that is not stepped down by the resistance ladder may be used as is.

In addition, the control circuit 20 includes a plurality of resistors (resistor ladder) 22 connected in series in a ladder form between the power supply line LVDD, through which the voltage VDDH is applied to the pixel 11, and the ground GND.

The connection positions of the resistors are switched by switches SW11 through SW15 made of resistors to obtain a voltage stepped down from the voltage VDDH by resistance of a predetermined number of resistors, and the voltage VDDRTH (second voltage) is supplied to the reset power supply control line LVDDRT.

Same as above, for example, when the switch SW11 is turned on, the voltage stepped down by resistance of one resistor is supplied to the reset power supply control line LVDDR. When the switch SW12 is turned on, the voltage stepped down by resistance of two resistors is supplied to the reset power supply control line LVDDR.

In addition, the control circuit 20 further includes a plurality of resistors (resistor ladder) 23 connected in series in a ladder form between the power supply line LVDD, through which the voltage VDDH is applied to the pixel 11, and the ground GND. The connection positions of the resistors are switched by switches SWT1 through SWT5 made of transistors to obtain a voltage stepped down from the voltage VDDH by resistance of a predetermined number of resistors. The obtained voltage is supplied as the ON voltage (the voltage VTXH (first voltage)) or the OFF voltage (voltage VTXL (third voltage) of the transfer transistor TX, to the control line LTX of the transfer transistor TX.

For example, when the switch SWT1 is turned on, the voltage stepped down by a resistance of one resistor is supplied to the control line LTX of the transfer transistor TX. When the switch SWT2 is turned on, the voltage stepped down by a resistance of two resistors is supplied to the control line LTX of the transfer transistor TX.

For example, the voltage VTXH and the voltage VTXL are input to the pulse control logic circuit 25, and one of the voltage VTXH and the voltage VTXL is output to the control line LTX of the transfer transistor TX.

The source voltage may be adjusted in the interior of the solid-state image sensor 100. There are five switches for each set of the resistors 21, 22, and 23 in FIG. 8. However, with an increase in the number of resistors connected in series between the power source of the pixel and the GND, the voltage can be adjusted more precisely.

Since the ON voltage (voltage VTXH) and the OFF voltage (voltage VTXL) of the transfer transistor TX generate a pulse of the voltage VTXH, the voltage VTXH is greater than the voltage VTXL (voltage VTXH>voltage VTXL), and the voltage VTXH and the voltage VTXL may be obtained using the same resistance ladder.

Except for the above, the same applies to the solid-state image sensor 100 according to the first embodiment. In the present embodiment, each of the voltage VTXH, the voltage VDDRTH, the voltage VTXL, and the voltage VRTL can be adjusted to a predetermined voltage and used.

The configuration of the solid-state image sensor 100 according to the present embodiment can eliminate or reduce the fixed pattern noise and blooming so that image quality is improved.

Third Embodiment

According to a third embodiment, an image capturing device 1000 that includes the solid-state image sensor 100 according to the first embodiment or the second embodiment is provided.

Figure 9:
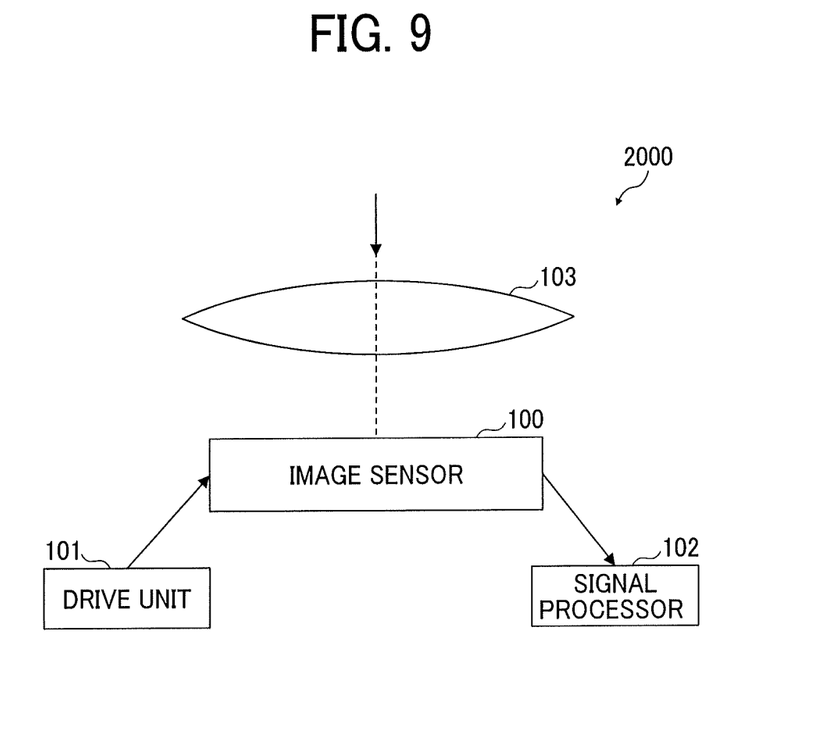
FIG. 9 is an illustration of a configuration of a camera system according to an embodiment of the present disclosure.

FIG. 9 is a diagram illustrating an example of a configuration of a camera system 2000 to which the solid-state image sensor 100 according to the first embodiment or the second embodiment is applied.

As illustrated in FIG. 9, the camera system 2000 includes the solid-state image sensor 100 according to the first embodiment or the second embodiment. The camera system 2000 has a lens 103 as an optical system that guides incident light to the photodiode PD of the solid-state image sensor 100. The lens 103 forms an image of the incident light on the imaging surface of the solid-state image sensor 100.

The camera system 2000 includes a drive unit 101 to drive the solid-state image sensor 100 and a signal processor 24 to process an output signal of the image sensor 100.

The drive unit 101 includes a timing generator to drive circuits in the image sensor 100 (to generate a drive timing signal), so as to drive the solid-state image sensor 100 using a predetermined timing signal.

The signal processor 102 performs predetermined signal processing on an output signal of the image sensor 100. The image signal processed by the signal processor 102 is recorded on a recording medium after subjected to an analog/digital converter including an analog front end (AFE) when the image signal is an analog output.

Alternatively, when the image signal is a digital output, the image signal is subjected to the digital signal processing performed by circuits such as a digital front end (DFE), and recorded on a recording medium.

As the recording medium, for example, a semiconductor storage device such as a memory card can be used, and no limitation is intended therein. Image information recorded in the recording medium is copied as a hard copy using, for example, a printer. The image signal processed by the signal processor 102 is displayed as a moving image on a monitor such as a liquid crystal display.

As described above, a high-precision camera can be provided with the solid-state image sensor according to the first embodiment or the second embodiment mounted in the image capturing device.

Further, the image capturing device provided with the solid-state image sensor according to the first embodiment or the second embodiment applicable to an area sensor and a line sensor other than the camera.

According to the image capturing device according to the embodiments of the present disclosure, the fixed pattern noise and blooming can be eliminated or reduced so that image quality is improved.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A solid-state image sensor comprising:
a plurality of pixels each including:
   a photoelectric convertor to convert a light signal of light striking the photoelectric convertor into an electrical charge;
   a transfer transistor to transfer the electrical charge from the photoelectric convertor to a floating diffusion;
   a reset transistor to reset the floating diffusion; and
   an amplifier transistor to amplify a signal when the floating diffusion is connected to a gate of the amplifier transistor, and
control circuitry configured to
   set a first voltage that is a gate voltage of the transfer transistor at a time of reading a signal of the pixel less than or equal to a second voltage that is a drain source voltage of the reset transistor, and
   set each of a third voltage and a fourth voltage higher than a voltage of a ground, the third voltage being a gate voltage of the transfer transistor at times other than the time of reading a signal of the pixel and the fourth voltage being a gate voltage of the reset transistor at times other than a reset time of the reset transistor.

2. The solid-state image sensor according to claim 1, wherein the control circuitry is configured to set the second voltage lower than a source voltage highest in the pixel.

3. The solid-state image sensor according to claim 1, wherein the control circuitry is configured to set the third voltage higher than the fourth voltage.

4. The solid-state image sensor according to claim 1, wherein the control circuitry includes a plurality of resistors connected in series in a ladder form between a power supply line, through which a source voltage is applied to the pixel, and the ground, each of the resistors including a plurality of switches,
wherein the control circuitry is configured to turn the plurality of switches on and off to change connection positions of the resistors to step down the source voltage by a resistance of a predetermined number of resistors, to obtain a voltage to be output as one of the first voltage, the second voltage, the third voltage, and the fourth voltage.

5. An image capturing device comprising:
the solid-state image sensor according to claim 1; and
an optical system to receive light, and guide the light to the photoelectric convertor of the solid-state image sensor; and
wherein the control circuitry is configured to process a signal output from the solid-state image sensor and drive the solid-state image sensor.

* * * * *